(12) United States Patent
Giersch et al.

(10) Patent No.: US 6,338,778 B1
(45) Date of Patent: Jan. 15, 2002

(54) VACUUM COATING SYSTEM WITH A COATING CHAMBER AND AT LEAST ONE SOURCE CHAMBER

(75) Inventors: Daniela Giersch, Munich; Robert Schalausky, Poecking; Goetz Mielsch, Munich; Hans-Joachim Scheibe, Dresden, all of (DE)

(73) Assignees: Bayerische Motoren Werke Aktiengesellschaft; Fraunhofer-Gesellschaft zur Foerderung der angewandten Forschung e.V., both of Munich (DE)

( * ) Notice: Subject to any disclaimer, the term of this patent is extended or adjusted under 35 U.S.C. 154(b) by 0 days.

(21) Appl. No.: 09/214,764
(22) PCT Filed: Jul. 10, 1997
(86) PCT No.: PCT/EP97/03653
   § 371 Date: Jan. 12, 1999
   § 102(e) Date: Jan. 12, 1999
(87) PCT Pub. No.: WO98/02596
   PCT Pub. Date: Jan. 22, 1998

(30) Foreign Application Priority Data

Jul. 12, 1996 (DE) .......................................... 196 28 102

(51) Int. Cl.[7] ............................................. C23C 14/32
(52) U.S. Cl. ..................... 204/192.38; 204/298.25; 204/298.26; 204/298.41; 118/719; 118/723 VE; 118/723 MP; 118/726; 118/727; 118/733; 427/569; 427/572; 427/580; 427/586; 427/596; 427/597
(58) Field of Search ................... 204/298.07, 298.11, 204/298.23, 298.25, 298.26, 298.41, 192.38; 118/719, 723 VE, 723 EB, 723 MP, 726, 727, 733; 727/569, 572, 580, 586, 587, 592, 593, 596, 597, 248.1

(56) References Cited

U.S. PATENT DOCUMENTS

| | | | |
|---|---|---|---|
| 3,649,339 A | 3/1972 | Smith | 417/152 |
| 3,865,625 A | 2/1975 | Cho et al. | 117/105 |
| 4,664,940 A * | 5/1987 | Bensoussan et al. | 427/596 |

(List continued on next page.)

FOREIGN PATENT DOCUMENTS

| | | |
|---|---|---|
| DE | 111 408 | 2/1975 |
| DE | 34 13 891 | 10/1985 |
| DE | 267 515 | 5/1989 |

(List continued on next page.)

OTHER PUBLICATIONS

Scheibe et al., "Film Deposition by LAser–Induced Vacuum Arc Evaporation", IEEE Transactions on Plasma Science, vol. 18, No. 6, pp. 917–922, Dec. 1990.*

(List continued on next page.)

Primary Examiner—Rodney G. McDonald
(74) Attorney, Agent, or Firm—Crowell & Moring LLP

(57) ABSTRACT

The invention relates to a device, in particular for a laser-induced vacuum are discharge evaporator for depositing of multiple layers with a high level of purity and high deposition rates on large-area components. According to the invention, the material source for the coating material is in a source chamber which can be evacuated and can be separated in a vacuum-tight manner from the actual coating chamber in which the substrate to be coated is located. The evaporator can, in particular, be used for deposition of amorphous carbon layers which are hydrogen-free and superhard and/or which contain hydrogen, in conjunction with high-purity metal layers or for the reactive plasma-enhanced deposition of, for example, oxidic, carbide, nitride hard material layers of ceramic layers or a combination thereof. The corresponding plasma sources can be flange-mounted on any suitable coating chambers and, consequently, also combined with conventional coating processes, for example magnetron sputtering.

9 Claims, 1 Drawing Sheet

U.S. PATENT DOCUMENTS

| | | | |
|---|---|---|---|
| 4,917,786 A | 4/1990 | Ehrich | 204/192.38 |
| 4,961,832 A | 10/1990 | Shagun et al. | 204/298.07 |
| 5,007,372 A * | 4/1991 | Hattori et al. | 118/719 |
| 5,215,589 A | 6/1993 | Schoenherr et al. | 118/720 |
| 5,364,219 A * | 11/1994 | Takahashi et al. | 204/298.25 |
| 5,401,543 A * | 3/1995 | O'Neill et al. | 427/580 |
| 5,614,273 A | 3/1997 | Goedicke et al. | 427/569 |

FOREIGN PATENT DOCUMENTS

| | | |
|---|---|---|
| DE | 279 695 | 8/1990 |
| DE | 43 42 574 | 4/1995 |
| DE | 43 36 681 | 5/1995 |
| DE | 44 43 740 | 6/1996 |
| EP | 0 158 972 | 10/1985 |
| EP | 0 398 365 | 11/1990 |
| EP | 0 559 233 | 9/1993 |

OTHER PUBLICATIONS

Japanese Abstract No. 56–065981, vol. 005, No. 132, Aug. 22, 1981.

Japanese Abstract No. 58–025474, vol. 007, No. 100, Apr. 28, 1983.

* cited by examiner

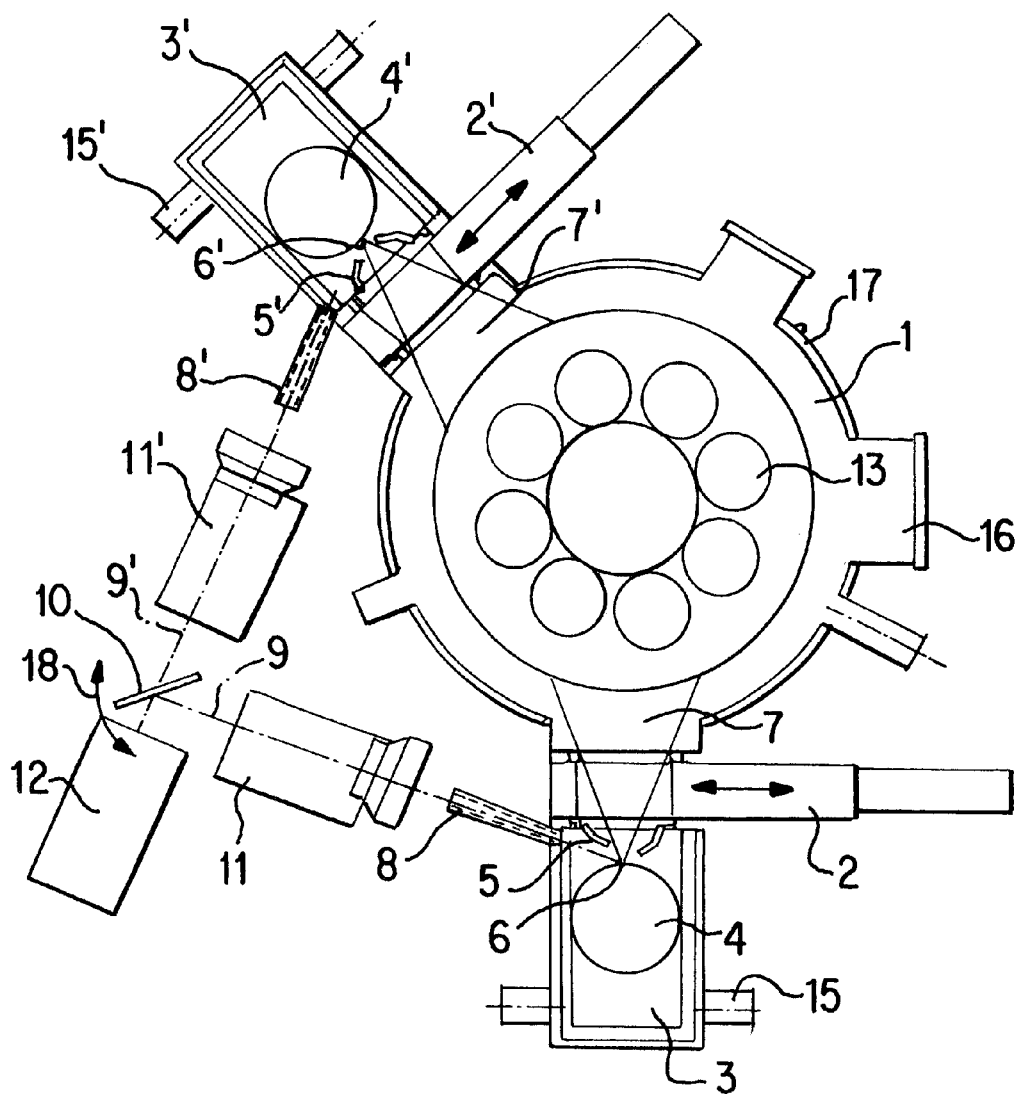

VACUUM COATING SYSTEM WITH A COATING CHAMBER AND AT LEAST ONE SOURCE CHAMBER

The invention relates to a vacuum coating system having a coating chamber, which can be evacuated, for a substrate to be coated, and having at least one source chamber connected therewith for a material source for the coating material. With respect to the known prior art—particularly with respect to advantageous further developments of the invention—reference is made to German Patent Document DD 279 695 A1, which is used as an example.

In the case of the vacuum coating systems known so far, the substrate to be coated as well as a material source for the coating material are essentially in a common space which can be evacuated and which, only by means of a so-called screen provided for the targeted guiding of the vaporous coating material, is virtually divided into a so-called coating chamber in which the substrate is situated and a so-called source chamber in which the material source for the coating material is situated. These two chambers of the space, which in the known prior art is a single space, are jointly evacuated in order to generate the vacuum required for the coating operation, but are also jointly ventilated when the substrate to be coated is removed from the vacuum coating system after the conclusion of the coating operation. However, this is a disadvantage because, in the process, the material source for the coating material comes in contact with ambient air and may be contaminated thereby, for example, by the precipitation of air humidity, which will be explained in detail below.

Another disadvantage of the joint arrangement of the substrate to be coated as well as of the material source essentially in a common space which can be evacuated will occur when there are disturbances on the material source for the coating material during the coating process. It may, for example, be required to exchange this material source although the coating process has not been completely concluded. Then the vacuum coating system must necessarily be opened and therefore ventilated, whereby the already started coating process is disturbed and the substrate, which has only been partially coated by this point in time, therefore becomes useless.

However, the known prior art is particularly disadvantageous in connection with the deposition of multiple layers, that is, of several layers of different materials on a substrate to be coated, in which case different material sources are also required.

For this deposition of multiple layers in combination with amorphous carbon layers, a laser-induced vacuum arc discharge evaporator is known from German Patent Document DE 279 695 A1, in the case of which the materials to be evaporated are applied in disk shape to a rotating roller-shaped cathode which is arranged at any point in relationship to the substrate to be coated in the vacuum recipient.

It is a disadvantage of this arrangement that the cathode consisting of different materials is situated in the common space or in the coating chamber and, despite appropriate shielding devices, it can therefore not be prevented that the passive materials of the roller-shaped cathode are contaminated such that the purity of the deposited layers or layer sequences cannot be ensured.

Another disadvantage is the fact that, as the result of the different abrasion of the individual cathode materials, the cathode-anode spacing is altered so non-uniformly that no constantly stable ignition conditions can be ensured in the case of any materials for long-lasting coating cycles under realistic, particularly series-production conditions. For ensuring these ignition conditions, a high-expenditure mechanical turning-off of the cathode roller is required, which considerably reduces the degree of utilization of the cathode material.

Another disadvantage is the result of the limited deflection possibilities of a laser beam under which the focal plane can be ensured on a target (this concerns the cathode or the material source for the coating material). This determines the length of a target (cathode) so that, in the case of a cathode constructed of different materials, no conditions can be ensured for the homogeneous deposition of these materials on large-surface substrates without additional high-expenditures substrate movements.

Another disadvantage of the cathode arrangement in the common space or in the coating chamber is caused by required ventilating cycles during the exchange of the substrate. As the result of the fact that the cathode material comes in contact with the ambient atmosphere, particularly water (air humidity) may precipitate on the cathode surface. This is particularly dramatic in the case of graphite because of its porosity (∼8%) in comparison to metals because, analogous to activated carbon, for example, water is embedded and stored in the case of graphite. Thus, no constant layer quality of high-grade amorphous carbon layers can be ensured since, particularly at the start of the coating process, hydrogen and oxygen are released and are included in the deposited layer. It was proven that the hardness of amorphous carbon layers is reduced by the embedding of hydrogen. For preventing such an embedding of hydrogen into the layer, an additional heating of the cathode is required before the start of the deposition. The reason is that, in principle, water should be avoided in the case of the low-temperature coating (<100° C.) because it has been proven to be the cause of an insufficient adhesion and resulting layer detachments.

It is therefore an object of the invention to provide a vacuum coating system which is improved with respect to the above and in the case of which there is no occurrence of at least the most serious above-indicated disadvantages. For achieving this object, it is provided that the coating chamber can be separated in a vacuum-tight manner from the source chamber which can be evacuated by itself. This means that the coating chamber can be evacuated or may remain when the source chamber is ventilated or—as explained in detail below—is exchanged for another source chamber.

Within the scope of advantageous further developments, which are indicated in the subclaims, it is an object of the invention to implement an arrangement for a laser-induced vacuum arc evaporator by means of which, under the conditions of a series production, on large-surface components (substrates) to be coated, homogeneous multiple layers consisting of at least two different material can be deposited in an effective manner.

Therefore, by means of a suitable device and arrangement of a laser-induced vacuum arc evaporator, it is to be possible to effectively deposit homogeneous multiple layers on large-surface components (substrates), in which case, a high operational safety of the evaporator is to be ensured while the utilization of the cathode material is good.

As indicated, according to the invention, the coating chamber in which the substrate to be coated is situated can be separated in a vacuum-tight manner from the source chamber which can be evacuated by itself and in which the material source for the coating material is situated. This means that either the coating chamber is accessible without any ventilation of the source chamber, or the source chamber is accessible without any ventilation of the coating chamber. This is possible in that one separate chamber respectively is provided for the substrate to be coated as well as for the material source for the coating material, in which case the connection between these two chambers required for the coating process can be interrupted. Naturally, it is necessary in this context to construct each chamber so that it can be evacuated separately; that is, a vacuum can in each case be generated separately in the coating chamber as well as in the source chamber. For the removal of the substrate as well as for the exchange of the material source in the coating chamber, these two chambers can therefore be separated from one another, for example, by means of a conventional plate valve which, in particular, has the shape of a separating wall.

However, this construction according to the invention is particularly advantageous when different coating materials are to be applied to the substrate because then a separate so-called source chamber can be provided for each coating material or for the pertaining material source.

The coating chamber can then be successively connected in a simple manner with different source chambers which is particularly advantageous for a series production, that is, for an industrial-scale coating of substrates. In the following, this will be explained in greater detail for a preferred application, specifically for the coating by means of a laser-induced vacuum arc evaporator, in which case each material source is arranged on a rotatable cathode and each cathode is arranged in a separate source chamber.

In this case, each type of material to be evaporated, in the form of a cathode rotating in a roller-type manner, is housed in a separate source chamber, in which case the individual source chambers can be evacuated sequentially and can be closed in a vacuum-tight manner by plate valves. It should be explicitly pointed out that, if, for example, two source chambers are present, only one of these two source chambers, can be evacuated preferably by means of a separate vacuum system assigned to this source chamber, while, for example, the cathode material can be exchanged at the other source chamber.

Preferably these source chambers are flanged to suitable positions of the coating chamber such that the cathode material of the source chamber whose plate valve was opened is deposited in a homogeneous manner and with high purity on a large-surface component/substrate. After the desired layer thickness has been reached on the substrate, the corresponding plate valve is closed and the next layer, consisting of the material of a second source chamber, is deposited after the opening of the corresponding plate valve. Only the plate valve of that source chamber is opened in each case from which material is just being evaporated so that the purity of the material in the other source chamber remains unchanged.

During the ventilation of the coating chamber for the exchange of the substrate, all source chambers remain closed in a vacuum-tight manner so that no air humidity or contaminations can precipitate on the cathodes.

For maintenance purposes or for exchanging the material source, each source chamber may be accessible separately from the outside, for example, by way of a removable wall section of the corresponding source chamber housing. The source chamber housing can also be detachably connected with the housing of the coating chamber, whereby, in the case of a suitable geometrical adaptation, optionally different source chamber housings may be fastened to one point of the coating chamber, or a certain source chamber housing can successively be assigned to different coating chambers.

In particular, such source chamber housing, which can be flanged on, may also be provided on a flow coating system with different coating chambers which may be separated from one another by pressure locks and which are described, for example, in German Patent Document DE 44 38 608 C2.

The coating process itself is characterized by the typical features of the laser-induced vacuum arc. By means of a pulsed high-power laser, which ensures in a stable manner by means of its parameters a power density of $10^8 Wcm^{-2}$ in the focus, the vacuum arc is ignited on the cathode surface. The burning duration of the arc, the material erosion and the plasma characteristics are determined by means of the pulsed current source linked with the cathode and the anode. The linear laser beam oscillation and the rotational movement of the cathode roller ensure a systematic and uniform abrasion of the whole cathode surface. By an adaptation of the cathode length to the substrate dimensions and by a simple linear and rotating substrate movement, a homogeneous coating of the whole substrate surface is achieved. For the effective deposition of multiple layers, at least two source chambers are flanged to a coating chamber, whose cathode rollers are each provided with coating material. In this context, it should be pointed out that naturally different materials may be provided on one cathode roller. For example, disks of aluminum, titanium and carbon can be alternatingly arranged successively or in a stacked manner on the cathode roller.

However, such a source chamber may also be flanged on instead of a target of a magnetron sputtering system so that a superhard amorphous carbon layer can be applied by means of the laser-controlled vacuum arc, for example, directly onto a layer applied by the magnetron.

In the following, the invention will be described in detail by means of an embodiment. The enclosed drawing illustrates an arrangement according to the invention of a laser-controlled vacuum arc coating evaporator with two source chambers which can be evacuated in a sequential manner.

A rotatable substrate holder, which is not described in detail, which can be cooled by water and can be acted upon by a bias voltage, is situated, preferably in its center, in a vacuum coating chamber 1 which can be evacuated by way of a pump connection piece 16, at least one substrate 13 to be coated being arranged on this substrate holder. Several substrates 13 to be coated are arranged here in the coating chamber 1 on a rotary table in a circular manner on substrate holders which can be rotated by themselves by way of a planet carrier, so that these several substrates 13 can be coated sequentially after one another, without the requirement of in-between opening the coating chamber 1, ventilating, and evacuating again after the inserting of further substrates.

Two source chambers 3, 3' are flanged at a right angle with respect to one another to the coating chamber 1 or to its housing 17. These source chambers 3, 3' each have a source chamber housing 14, 14', in which one pump connection piece 15, 15' respectively is provided for evacuating the source chambers 3, 3'.

By means of one plate valve 2, 2' respectively, which can be moved in the direction of the illustrated arrow, the source chambers 3, 3' can be separated in a vacuum-tight manner from the coating chamber 1 or, by an opening the respective plate valve 2, 2', they can be selectively connected with the coating chamber 1. By means of a pump stand consisting of a backing pump and of a high vacuum pump (such as a micromolecular pump), a vacuum of approximately $10^{-4}$ Pa is generated in the source chambers 3, 3' independently of one another and also independently of the coating chamber 1 by way of the pump connection pieces 15, 15' while the plate valves 2, 2' are closed.

A roller-shaped cathode 4, which is arranged in the first source chamber 3 and acts as a material source, consists, for example, of a high-purity electrode graphite, while a cathode 4, which is situated in the second source chamber 3' and acts as another material source, is made of a high-purity aluminum.

The source chamber housing 14, 14' comprises light duct connection pieces which are not shown in detail, are open toward the interior of each source chamber 3, 3' and are closed in a vacuum-tight manner on the end side by one window 8, 8' respectively. By means of these windows 8, 8', which are therefore mounted at a suitable point on the source chambers 3, 3', the beam 9, 9' of a pulsed Nd—YAG laser 12 for the ignition and guidance of a vacuum arc is directed onto one of the two cathodes 4, 4'.

The beam 9, 9' of the Nd—YAG laser 12 operating as a pulsed laser may be guided by way of a deviation mirror 10 swivellable in the direction of the arrow 18 optionally into the source chamber 3 or 3'. By means of plane field lenses 11, 11' arranged in each case in front of inlet windows 8, 8', the focussing of the laser beam 9, 9' takes place onto the point on the surface of the cathode 4 or 4' which is required for the arc ignition, and its deflection takes place linearly along the whole cathode length. These plane field lenses 11, 11' therefore represent a so-called focussing and deflecting lens system.

The preferred laser parameters may be as follows: Wavelength 1.06 $\mu$m, pulse length 90 ns (half intensity width), pulse energy >15 mJ, so that, in the focus, power densities >5·$10^8$ Wcm$^{-2}$, the threshold value for generating plasma, can be reached in a stable manner at repetition rates of up to 1 kHz.

Approximately 5 mm above the cathodes 4, 4', anodes 5, 5' are arranged in the source chambers 3, 3' such that, as the result of the laser-induced ignition plasma 6, 6', stable ignition conditions exist for an arc and thus stable propagation conditions for the respective arc-induced coating plasma 7, 7', that is, for the delivered coating material. The cathode 4, 4' and the anode 5, 5' are connected with a pulsed current source which ensures, for example, in a stable manner a maximal arc current of 1.5 kA at an arc drop voltage of approximately 60 V, at a pulse length of 100 $\mu$m and at a repetition rate of 1 kHz.

After at least one corresponding substrate 13 was mounted on the substrate holder in the coating chamber 1, in which case the surface to be coated was pretreated by a conventional cleaning process, such as a glow process (sputtering with argon ions), by means of the above-mentioned pump stand, by way of the pump connection piece 16, a working pressure of $10^{-4}$ Pa is generated also in the coating chamber 1. After the working pressure has been reached, the first plate valve 2' is opened up and the depositing of aluminum is started in that the laser beam 9' is guided by way of the deviation mirror 10 onto the cathode 4' and is guided linearly along the whole cathode length. After the desired layer thickness of 20 nm has been reached on the whole substrate surface, which is controlled in the case of the calibrated arrangement by counting the arc pulses, the plate valve 2' is closed and the laser beam 9 is mirrored onto the second cathode 4 by the swivelling of the deviation mirror 10. With the opening of the plate valve 2 assigned to this source chamber 3, an amorphous carbon layer of a thickness of 20 nm is deposited on the substrate surface with a corresponding pulse selection. This activates the source chamber 3, after the source chamber 3' had been activated first. By means of repeating the corresponding cycles, a multiple layer consisting of aluminum and amorphous carbon is deposited which has an overall layer thickness of 2 $\mu$m and individual layer thicknesses of 20 nm and 100 individual layer pairs. Depending on the selection of the number of arc pulses for the respective material and of the corresponding cycles, the layer construction, the individual and overall layer thickness can be varied arbitrarily.

During the ventilating of the coating chamber 1 for exchanging the substrate or substrates 13, the source chambers 3, 3' may advantageously remain exposed to a high vacuum.

However, deviating form the illustrated embodiment, it is also possible to produce the coating material in a source chamber by means of magnetron sputtering. Thus, it is possible, for example, to replace on a magnetron sputtering system, which contains four magnetrons offset in each case by 90 degrees, one of these magnetrons by a source chamber having a carbon roller. By means of the known magnetron sputtering process, a layer system of Ti, TiN, TiCN, TiC with respective individual layer thicknesses of 500 nm can be applied to the plane substrate 13 arranged in a rotating manner in the center of the chamber. Subsequently, the coating chamber 13 is evacuated to a pressure of $10^{-4}$ Pa. After the opening of the plate valve 2 of the source chamber 3, by means of the laser-induced vacuum arc, analogously to the above-mentioned process sequence, a layer of a thickness of 300 nm of superhard amorphous carbon is applied. However, this as well as a plurality of additional details may definitely be designed to deviate therefrom and particularly to deviate from the illustrated embodiment without leaving the content of the claims.

LIST OF REFERENCE NUMBERS 1 vacuum coating chamber
2,2' first and second plate valve
3,3' first and second source chamber
4,4' first and second cathode acting as a material source
5,5' first and second anode
6,6' (respective) laser-induced ignition plasma
7,7' (respective) arc-induced coating plasma
8,8' window on 3,3'
9,9' beam of a laser which arrives in 3 and 3'
10 deviation mirror
11,11' first and second plane field lens
12 laser
13 substrate to be coated
14,14' first and second source chamber housing
15,15' pump connection piece of 3, 3'
16 pump connection piece of 1
17 housing of 1
direction of the arrow: swivelling of 10

What is claimed is:

1. A vacuum coating system for a substrate to be coated, comprising:
   a coating chamber which is evacuatable;
   at least two source chambers, each of said source chambers being removably connected with the coating chamber, and each of the source chambers being separately evacuatable and being evacuated separately from the coating chamber;
   a single laser source generating a laser beam; and
   a swivellable scanning mirror arranged to guide the laser beam to a respective one of the source chambers to be activated and, in the respective one of the source chambers, over a cathodic material source arranged therein, said single laser being operable in a pulsed manner.

2. The vacuum coating system according to claim 1, further comprising a separating-wall plate shaped valve mounted between the coating chamber and each of the source chambers.

3. The vacuum coating system according to claim 2, wherein at least one of the source chambers has a housing detachably connected with a coating chamber housing of the coating chamber.

4. The vacuum coating system according to claim 1, wherein at least one of the source chambers has a housing detachably connected with a coating chamber housing of the coating chamber.

5. A vacuum coating system for a substrate to be coated, comprising:
   a coating chamber;
   at least two source chambers each removably coupled to said coating chamber;
   a single energy source coupled with the source chambers for controllably creating an arc discharge in each of said source chambers; and
   wherein the coating chamber is separable from the source chambers, and further wherein the source chambers are separately evacuated and are also evacuated separately from the coating chamber.

6. The vacuum coating system according to claim 5, further comprising an optical system for guiding the energy source to each of the source chambers.

7. The vacuum coating system according to claim 5, further comprising a plate valve respectively mounted between the coating chamber and each of the source chambers for separating the coating chamber from the respective source chamber.

8. The vacuum coating system according to claim 5, further comprising a detachable mount for connecting the source chambers to the coating chamber.

9. A method of vacuum coating a substrate to be coated in a coating chamber, the method comprising the acts of:
   evacuating the coating chamber;
   providing a plurality of source chambers mounted for different coating materials, each of said source chambers being separately evacuated from each other and separately evacuated from said coating chamber;
   evaporating a coating material in at least one of the source chambers to generate a coating plasma;
   individually coupling the source chambers with the coating chamber to coat the substrate by the coating plasma and
   providing a single energy source coupled with the source chambers for controllably creating an arc discharge in each of said source chambers.

* * * * *